US008543966B2

(12) United States Patent
Bickford et al.

(10) Patent No.: US 8,543,966 B2
(45) Date of Patent: Sep. 24, 2013

(54) TEST PATH SELECTION AND TEST PROGRAM GENERATION FOR PERFORMANCE TESTING INTEGRATED CIRCUIT CHIPS

(75) Inventors: Jeanne P. Bickford, Essex Junction, VT (US); Peter A. Habitz, Hinesburg, VT (US); Vikram Iyengar, Pittsburgh, PA (US); David E. Lackey, Jericho, VT (US); Jinjun Xiong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/294,210

(22) Filed: Nov. 11, 2011

(65) Prior Publication Data
US 2013/0125073 A1 May 16, 2013

(51) Int. Cl.
*G06F 11/22* (2006.01)
*G06F 17/50* (2006.01)

(52) U.S. Cl.
USPC ........... 716/136; 716/106; 716/108; 716/111; 716/115; 716/113; 714/724; 714/730; 714/731; 714/732; 714/733

(58) Field of Classification Search
USPC ................. 716/106, 108, 111, 112, 113, 134; 324/500, 760, 765, 763; 714/724, 730, 731, 714/732, 733, 734, 735
See application file for complete search history.

(56) References Cited

U.S. PATENT DOCUMENTS

| | | | |
|---|---|---|---|
| 5,442,282 A * | 8/1995 | Rostoker et al. | 324/756.04 |
| 6,327,686 B1 | 12/2001 | Grundmann | |
| 6,512,392 B2 * | 1/2003 | Fleury et al. | 324/762.03 |
| 7,327,185 B2 | 2/2008 | Mair et al. | |
| 7,424,694 B2 * | 9/2008 | Ikeda | 716/113 |
| 7,475,366 B2 | 1/2009 | Kuemerle et al. | |
| 7,640,143 B2 | 12/2009 | Bittner et al. | |
| 7,647,573 B2 | 1/2010 | Abadir et al. | |
| 7,856,607 B2 | 12/2010 | Grise et al. | |
| 7,886,247 B2 | 2/2011 | Fatemi et al. | |
| 7,944,446 B2 * | 5/2011 | Shibuya et al. | 345/440 |
| 7,958,470 B1 * | 6/2011 | Siarkowski | 716/104 |
| 8,307,316 B2 * | 11/2012 | Albrecht et al. | 716/113 |
| 2003/0115524 A1 * | 6/2003 | Johnston et al. | 714/726 |
| 2004/0002844 A1 | 1/2004 | Jess et al. | |

(Continued)

OTHER PUBLICATIONS

Iyengar et al., Variation-Aware Performance Verification Using At-Speed Structural Test and Statistical Timing, I-4244-1382—Jun. 2007 copyright 2007 IEEE, pp. 405-412.

(Continued)

*Primary Examiner* — Nha Nguyen
*Assistant Examiner* — Brian Ngo
(74) *Attorney, Agent, or Firm* — Schmeiser, Olson & Watts; Michael LeStrange

(57) ABSTRACT

A method of test path selection and test program generation for performance testing integrated circuits. The method includes identifying clock domains having multiple data paths of an integrated circuit design having multiple clock domains; selecting, from the data paths, critical paths for each clock domain of the multiple clock domains; using a computer, for each clock domain of the multiple clock domain, selecting the sensitizable paths of the critical paths; for each clock domain of the multiple clock domain, selecting test paths from the sensitizable critical paths; and using a computer, creating a test program to performance test the test paths.

24 Claims, 9 Drawing Sheets

(56) References Cited

U.S. PATENT DOCUMENTS

| | | |
|---|---|---|
| 2004/0025123 A1 | 2/2004 | Angilivelil |
| 2004/0093107 A1* | 5/2004 | Good et al. .................. 700/108 |
| 2005/0182587 A1* | 8/2005 | Sato et al. .................... 702/117 |
| 2007/0255516 A1 | 11/2007 | Patel et al. |
| 2008/0263489 A1 | 10/2008 | Canada et al. |
| 2008/0276212 A1* | 11/2008 | Albrecht ......................... 716/10 |
| 2009/0037788 A1* | 2/2009 | Comai et al. .................. 714/744 |
| 2009/0193373 A1 | 7/2009 | Abbaspour et al. |
| 2009/0327986 A1* | 12/2009 | Goswami et al. ................. 716/6 |
| 2010/0146469 A1* | 6/2010 | Chowdhury .................... 716/10 |
| 2011/0121838 A1* | 5/2011 | Gillis et al. .................... 324/537 |
| 2011/0153055 A1* | 6/2011 | Sheu et al. .................... 700/121 |

OTHER PUBLICATIONS

Xiong et al., Optimal Margin Computation for At-Speed Test, 978-3-9810801-3-1/DATE08 copyright 2008 EDAA, 6 pages.

Xiong et al., Statistical Multilayer Process Space Coverage for At-Speed Test, DAC'09, Jul. 26-31, 2009, San Francisco, CA, USA copyright 2009 ACM 978-1-60558-497—Mar. 9, 2007, 6 pages.

Xiong et al., Pre-ATPG Path Selection for Near Optimal Post-ATPG Process Space Coverage, ICCAD'09, Nov. 2-5, 2009, San Jose, CA, USA, copyright 2009, ACM 978-1-60558-800—Jan. 9, 2011, pp. 89-96.

Zolotov et al., Statistical Path Selection for At-Speed Test, 978-1-4244-2820—May 2008 copyright 2008 IEEE, pp. 624-631.

Ben et al., Estimating the Probability Density Function of Critical Path Delay via Partial Least Squares Dimension Reduction, 978-1-61284-914-0/11 copyright 2011 IEEE, 7 pages.

Bastani et al., Feature-Ranking Methodology to Diagnose Design-Silicon Timing Mismatch, 0740-7475/10 copyright 2010, IEEE Design & Test of Computers, pp. 42-52.

Singh et al., Binning for IC Quality: Experimental Studies on the SEMATECH Data, 7 pages.

Boskin et al., IC Performance Prediction from Electrical Test Measurements, 0-7803-0680 copyright 1992 IEEE/SEMI Int'l Semiconductor Manufacturing Science Symposium, pp. 13-17.

Cory et al., Speed Binning with Path Delay Test in 150-nm Technology, 0740-7475/03/ copyright 2003 IEEE Design & Test of Computers, Sep.-Oct. 2003, pp. 41-45.

\* cited by examiner

US 8,543,966 B2

TEST PATH SELECTION AND TEST PROGRAM GENERATION FOR PERFORMANCE TESTING INTEGRATED CIRCUIT CHIPS

FIELD OF THE INVENTION

The present invention relates to the field of integrated circuits; more specifically, it relates to methods of selecting critical delay paths of integrated circuits for performance testing integrated circuit chips.

BACKGROUND

A current method of testing the performance of integrated circuits relies on a functional test of the logic circuits of the integrated circuits. This method consumes large amounts of time and computer/tester resource to generate the test code and to perform the actual test itself. Another current method of testing the performance of integrated circuits relies on performing a performance screen on ring oscillators formed in various physical locations on the integrated circuit chip. The problem with this technique is false rejects and false accepts because ring oscillator performance does not measure metal line variation. Accordingly, there exists a need in the art to mitigate the deficiencies and limitations described hereinabove.

SUMMARY

A first aspect of the present invention is a method, comprising: identifying clock domains having multiple data paths of an integrated circuit design having multiple clock domains; selecting, from the data paths, critical paths for each clock domain of the multiple clock domains; using a computer, for each clock domain of the multiple clock domain, selecting the sensitizable paths of the critical paths; for each clock domain of the multiple clock domain, selecting test paths from the sensitizable critical paths; and using a computer, creating a test program to performance test the test paths.

A second aspect of the present invention is a method, comprising: (a) identifying clock domains having multiple critical paths of an integrated circuit design having multiple clock domains; (b) selecting a clock domain of the multiple clock domains; (c) selecting N critical paths of the clock domain; (d) using a computer, retaining only sensitizable critical paths of the N critical paths; (e) selecting M of the sensitizable critical paths to include paths from different regions of the integrated circuit design and to include sensitizable paths of different Vt families; (f) generating timing test margins for the M sensitizable critical paths; (g) setting up test clock frequencies for each of the M sensitizable critical paths; (h) repeating steps (b) through (g) for each clock domain of the multiple clock domains.

A third aspect of the present invention is a method, comprising: (a) generating a latch location file of critical path latches of an integrated circuit design; (b) partitioning the integrated circuit design into R multiple contiguous regions, each region including at least one clock domain; (c) selecting a region of the multiple regions; (d) selecting a clock domain of the selected region; (e) selecting critical path latches of the clock domain; (f) selecting Z latches of the critical path latches of the clock domain; (g) for each of the Z latches selecting P statistical paths; (h) using a computer, retaining only sensitizable paths of the Z*P statistical paths; (i) selecting W sensitizable paths of the sensitizable paths the Z*P statistical paths; (j) repeating steps (d) through (i) for each clock domain of the selected region; (k) selecting K of sensitizable paths of W sensitizable paths of all clock domains of the selected region; (l) repeating steps (c) through (k) for all the regions of the integrated circuit design; and (m) returning K times R sensitizable paths grouped by clock domain.

A fourth aspect of the present invention is a computer program product, comprising: a computer usable storage device having a computer readable program code embodied therein, the computer readable program code comprising an algorithm adapted to implement a method for test path selection and test program generation for performance testing integrated circuit chips, the method comprising the steps of: identifying clock domains having multiple data paths of an integrated circuit design having multiple clock domains; selecting, from the data paths, critical paths for each clock domain of the multiple clock domains; for each clock domain of the multiple clock domain, selecting the sensitizable paths of the critical paths; for each clock domain of the multiple clock domain, selecting test paths from the sensitizable critical paths; and creating a test program to performance test the test paths.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The embodiments of the present invention select critical paths (paths where timing delays are critical to the integrated circuit meeting performance specifications) from each clock domain of the integrated circuit. The selection is performed using methodologies that ensure that the selected critical paths provide test coverage for all physical regions of the integrated circuit chip having clocked logic circuits by selecting paths from all clock domains. The method of the embodiments of the present invention may be called Path Performance Testing (PPT).

The term critical path is defined as a data path between an input point and an output point where the time delay of the data signal being presented at the input point and received at the output point must be between upper and lower performance specifications or the integrated circuit will be rejected. Not all data paths are critical paths. In one example, the input and output points of data paths are latches. In one example, the input and output points of data paths are latches of Level Sensitive Scan Design (LSSD) scan chains.

Figure 1:
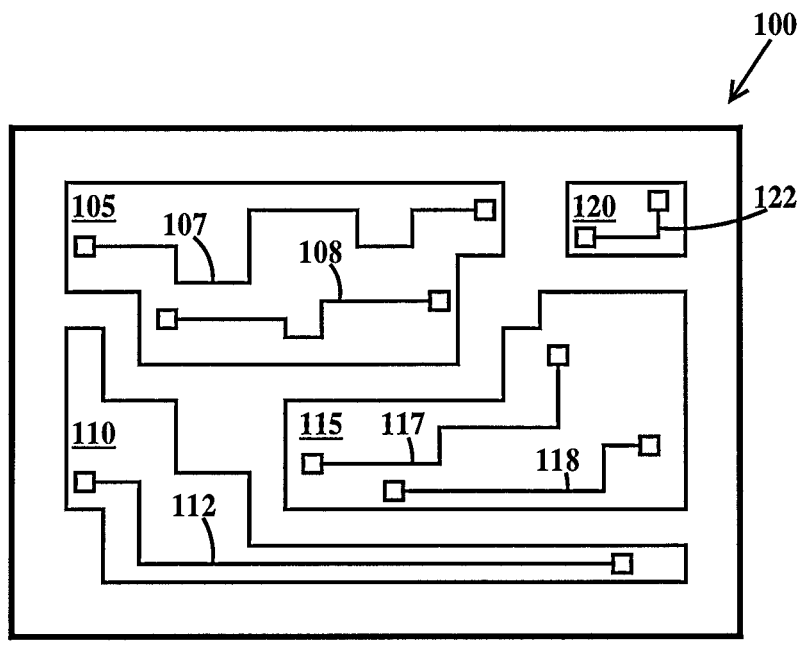
FIG. 1 illustrates clock domains and data paths of an exemplary integrated circuit chip.

FIG. 1 illustrates clock domains and data paths of an exemplary integrated circuit chip. In FIG. 1, an integrated circuit chip 100 includes a clock domain 105 having critical paths 107 and 108, a clock domain 110 having a critical path 112, a clock domain 115 having critical paths 117 and 118 and a clock domain 120 having a critical path 122. A clock domain is logical region of an integrated circuit chip where the elements (e.g., latches, logic gates, etc.) of all critical paths are clocked with the same clock signal. The clock signals of different clock domains may differ from each other in, for example, having different periods, different frequencies, being independently powered (some clock domains may be turned off while others remain powered) and are not necessarily synchronous to each other. While four clock domains are illustrated in FIG. 1, there may be more or less than four clock domains. The number of critical paths within any given clock domain may be more than tens of thousands.

Figure 2:
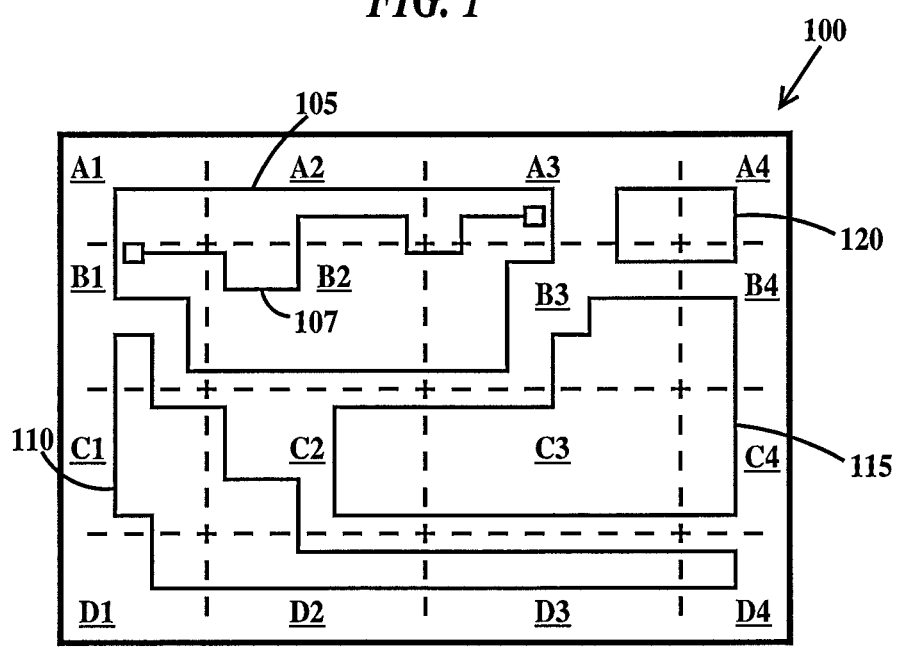
FIG. 2 illustrates the exemplary integrated circuit chip of FIG. 1 partitioned into regions for practicing an embodiment of the present invention.

FIG. 2 illustrates the exemplary integrated circuit chip of FIG. 1 partitioned into regions for practicing an embodiment of the present invention. In FIG. 2, integrated circuit 100 has been partitioned into sixteen contiguous regions A1, A2, A3, A4, B1, B2, B3, B4, C1, C2, C3, C4, D1, D2, D3, and D4. Some regions include portions of only one clock domain (e.g., clock region A1 includes only a portion of clock region 105) and some clock regions may include portions of multiple clock regions (e.g., region B1 includes a portion of clock domain 105 and 110). Some regions may include no clock domains. While critical paths 108, 112, 117, 118 and 122 of FIG. 1 are not illustrated in FIG. 2 for clarity, critical path 107 has been illustrated to show that any given critical paths may cross region boundaries. For example, critical path 107 starts in region B1, passes through region B2, then through A2, back again into region B2, then through region B3 and ends in region A3.

Figure 3:
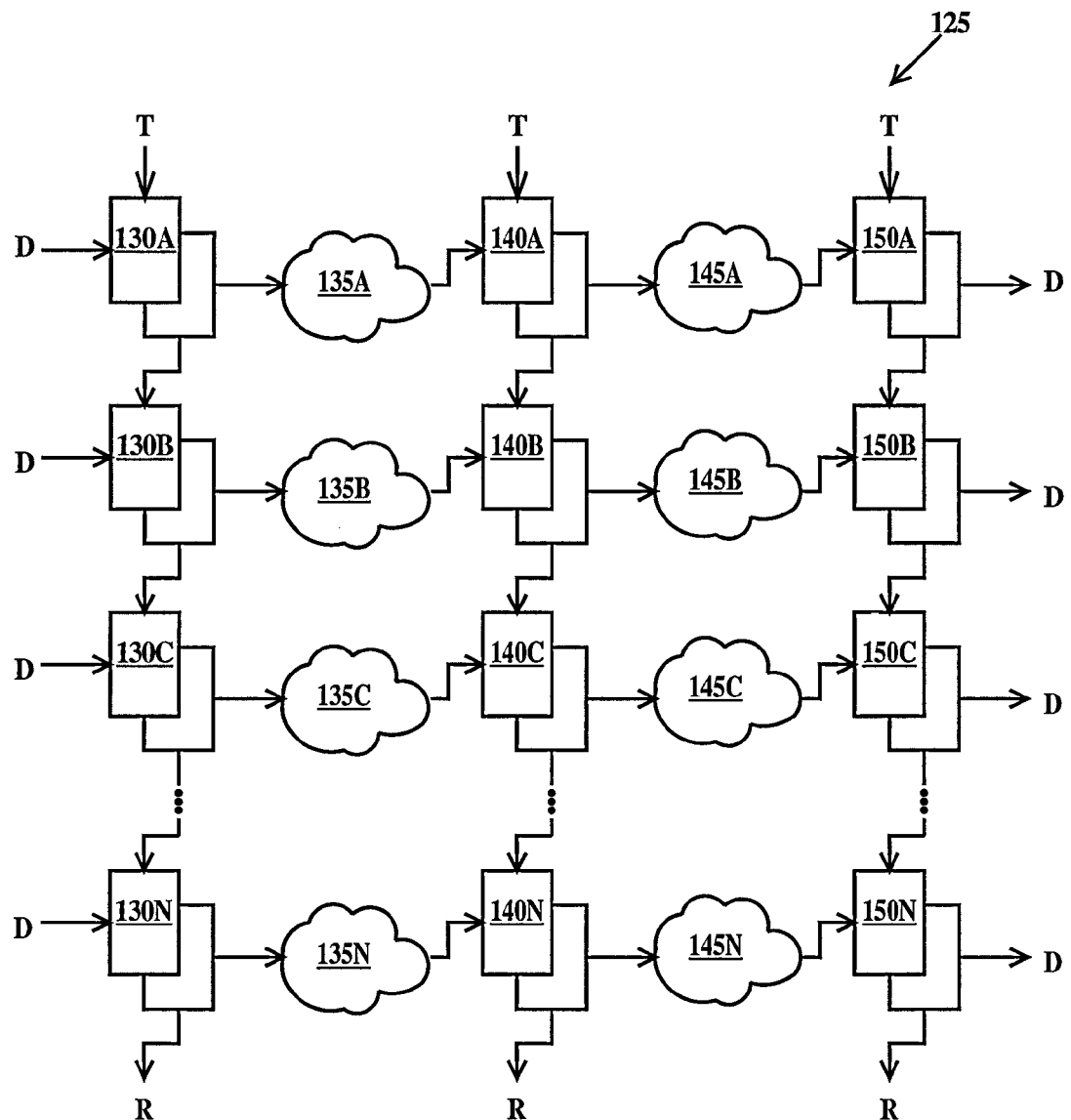
FIG. 3 is an exemplary schematic diagram of a scan latch circuit used in testing logic circuits of integrated circuits.

FIG. 3 is an exemplary schematic diagram of a scan latch circuit used in testing logic circuits of integrated circuits. In FIG. 3, and LSSD scan chain 125 includes a first set of latches 130A through 130N, a second set of latches 140A through 140N and a third set of latches 150A through 150N. Each latch has a first input for operational data, a second input for test data, a first output for operational data and a second output for resultant test data. Data is clocked through logic gates in clouds of logic 135A through 135N from respective latches 130A through 130N to respective latches 140A through 140N by a data clock, usually designated the "A" clock. Data is clocked through logic gates in clouds of logic 145A through 145N from respective latches 140A through 140N to respective latches 150A through 150N by the same data clock. Test data is clocked through latches 130A through 130N, latches 140A through 140N and through latches 150A through 150N, by a first test clock, usually designated clock "C." Test data is clocked through logic circuits 135A to 145A through logic circuits 135N to 145N by a second test clock, usually designated clock "B." Clock "A" is the domain clock.

A critical path starts and stops with a scan latch and includes a data path within the logic gates of the logic cloud connected by the two scan latch, for example latch 130A, logic cloud 135A and latch 140A. It is possible for other scan latch to be part of the critical path between the two latches, for example, latch 130C, logic cloud 135C, latch 140C, cloud of logic 145C and latch 150C.

Figure 4:
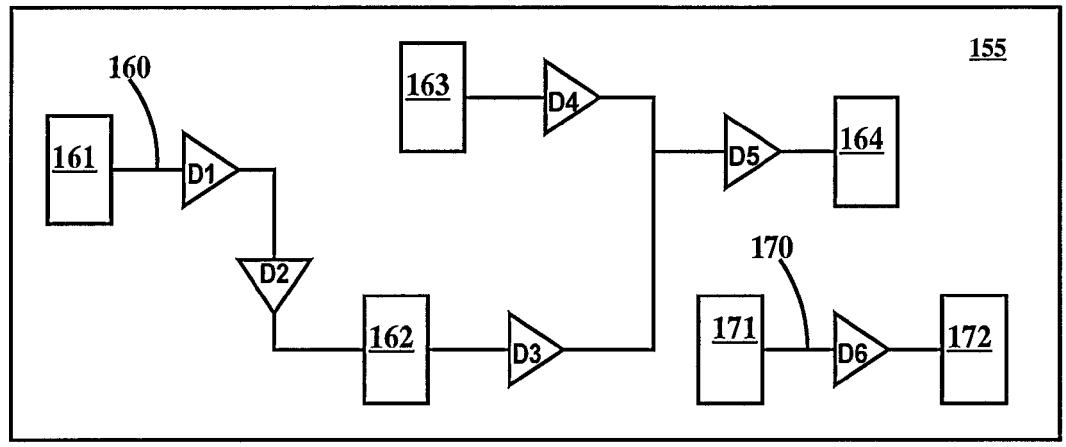
FIG. 4 is a schematic diagram illustrating two critical paths belonging to different clock domains in a same region of an integrated circuit chip.

FIG. 4 is a schematic diagram illustrating two critical paths belonging to different clock domains in a same region of an integrated circuit chip. In region 155, a logic circuit 160 of a first clock domain comprises latches 161, 162, 163 and 164 and delays D1, D2, D3, D4 and D5. The delays represent the timing delay through combination logic (sequences of logic gates). There are three possible critical paths for logic circuit 160. The first is latch 163, delay D4, delay D5, and latch 164. The second is latch 162, delay D3, delay D5, and latch 164. The third is latch 161, delay D1, delay D2, latch 162, delay D3, delay D5, and latch 164. Region 155 also includes a logic circuit 170 of a second clock domain and comprising latches 171 and 172 and delay D6. Logic circuit 160 presents a problem in that the output at latch 164 depends on the output of delays D3 and D4. This is resolved by an algorithm called "branch-and-bound."

Figure 5:
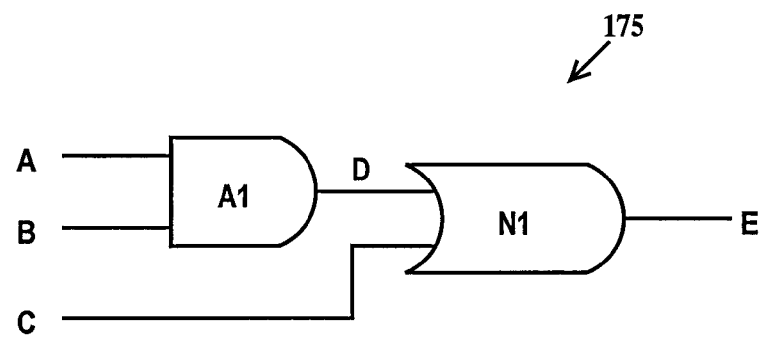
FIG. 5 is an exemplary schematic diagram of a simple logic circuit illustrating the principle of path sensitization.

FIG. 5 is an exemplary schematic diagram of a simple logic circuit illustrating the principle of path sensitization. In FIG. 5, a logic circuit comprises an AND gate A1 having a first input A and a second input B, and output D which is also a first input of a NAND gate N1, having a second input C and an output E. To robustly test the path A to E, C must be kept a zero if a fault on A is to be detected independent of the value on B. The test pattern generated for testing the path A to E must include placing a zero on C while A transitions from zero to one and from one to zero. The same is true for robustly testing the path B to E. Application of path sensitization ensures that only robust tests are created for a given critical path, with no glitches, false fails or false accepts (test escapes).

Figure 6:
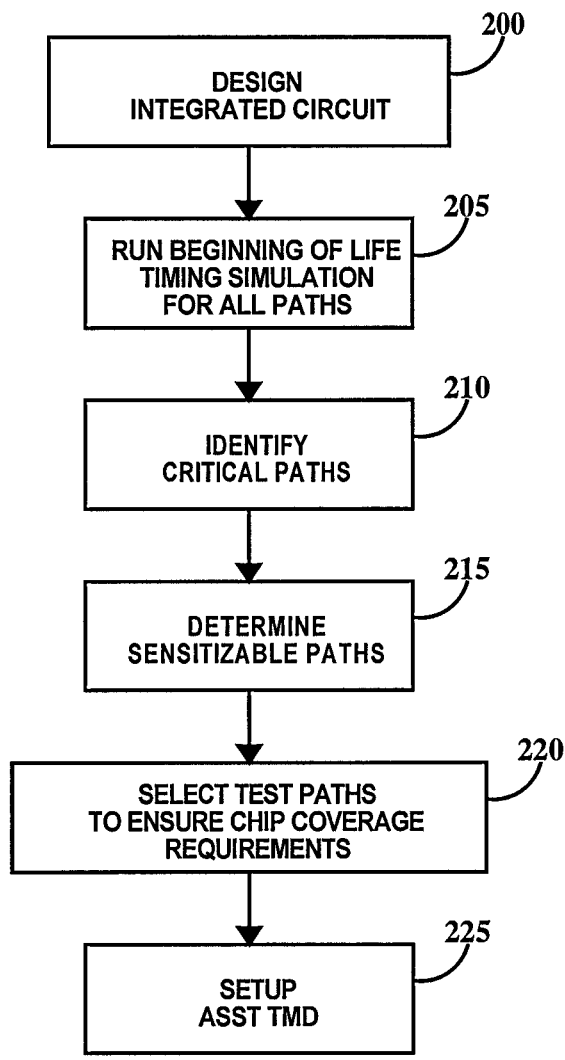
FIG. 6 is a flow diagram of the concept of test path selection according to embodiments of present invention.

FIG. 6 is a flow diagram of the concept of test path selection according to embodiments of present invention. In step 200, an integrated circuit is designed. In step 205, a beginning of life timing simulation for all data paths is performed to generate process parameter values. For example, the simulated delay of path i is Di. Running a canonical timing model of path i gives the delay as a function of nominal process delay DNi and process parameter induced delay SPi. Solving the equation $Di=DNi+\Sigma^{P}(SPi)$ gives values for path i for DN and Sp. The equation is solvable when the number of paths n is larger than the number of parameters P. In step 210, the critical paths are identified. In step 215, the sensitizable paths are identified. The sensitizable paths are the subset of critical paths that are testable. Sensitizable paths are generated, for example, using an Automatic Test Pattern Generator (ATPG) check program. In step 220, a subset of the sensitizable paths (i.e., test paths) is selected to ensure adequate integrated circuit chip test coverage. The test paths should provide test coverage for delay limits (e.g., $2\sigma$, $3\sigma$, etc.) for the following process parameters: across chip variations (e.g., high and low density of polysilicon lines, high and low density of substrate isolation, density of wiring, etc.) and wiring levels (e.g., which wiring levels are used and the length of wire on each level). Test paths should not be chosen from chip regions with large AC power drops as the voltage will not be the same along the whole path and the transistors in the path will switch at different nominal speeds. A general methodology for selecting the subset of sensitizable parts is described infra with respect to FIGS. 7 and 8. More specific embodiments are described infra with respect to FIGS. 9 and 10. In step 225, a test program is generated, for example, a PPT At Speed Structural Test (ASST) including Test Manufacturing Data (TMD) is generated. The TMD contains the information required to setup a tester to perform PPT ASST testing according to embodiments of the present invention.

Figure 7:
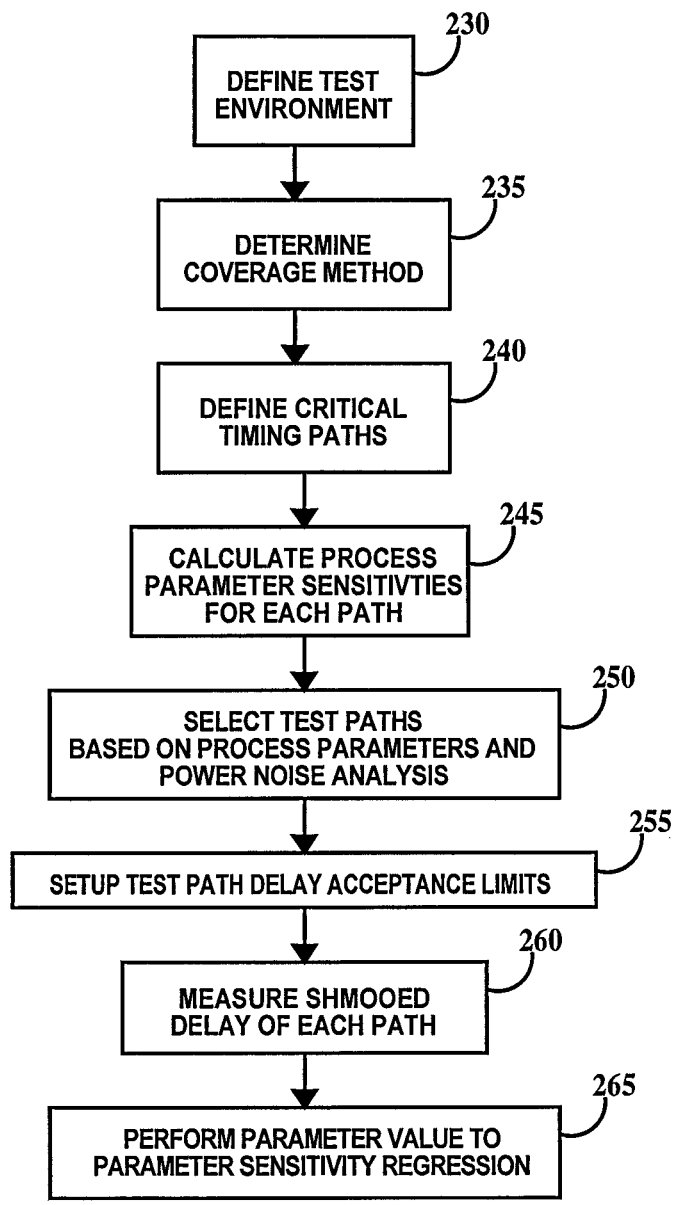
FIG. 7 is a flow diagram of the general method of test path selection according to embodiments of present invention.

FIG. 7 is a flow diagram of the general method of test path selection according to embodiments of present invention. In step 230, the test environment is defined. This includes running an across-chip AC power noise simulation which includes power-up-power-down cycling to select a power level range having minimum or no signal-to power coupling noise to perform a static timing simulation. Then the static timing is performed with the selected power range and a test temperature, to set beginning of life timing parameters. In step 235, the test coverage method for PPT (see FIGS. 9 and 10 and discussion infra) is selected. In step 240, critical paths by clock domain are selected. In step 245, for each critical path, timing delay sensitivities to process parameter are calculated. In step 250, a subset of the critical paths (i.e., test paths) is selected. The selection criteria includes: selecting critical paths with a range of different process parameters and selecting critical paths within the low power supply voltage variation region of the integrated circuit design. The low power supply voltage variation regions are determined from the AC power noise simulation of step 230. It is preferred that the critical paths start in regions of the integrated circuit away from power sources (e.g., where power is physically supplied to the integrated circuit. In step 255, test path delay limits acceptance limits are setup. These include worst case (WC) (e.g., late data arrival and early clock at the input point of the path) and best case (BC) (e.g., early data arrival and late clock at the input point of the path). In step 260, the frequency shmooed delay of each path of a subset of the critical paths is run on a sample of integrated circuit chips using a tester. The results are evaluated in step 280 of FIG. 8 discussed infra.

Figure 8:
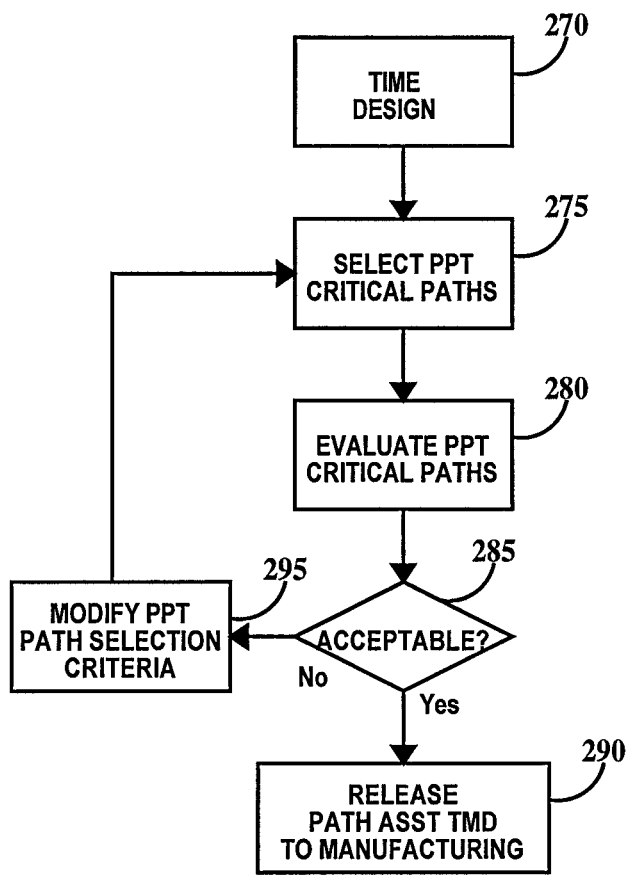
FIG. 8 is a flow diagram of the method of verifying the selected test paths according to embodiments of present invention.

FIG. 8 is a flow diagram of the method of verifying the selected test paths according to embodiments of present invention. In step 270, the integrated circuit design is timed as described supra. In step 275, the test paths are selected as described supra. In step 280, the test paths are evaluated by testing a sample of physical integrated circuit chips as illustrated in steps 255, 260 and 265 of FIG. 7 and described supra. In step 285 it is determined from the regression analysis if the Path ASST TMD results are acceptable. If the results are acceptable, then in step 290, the Path ASST TMD is released to manufacturing test. If the results are acceptable, then in step 295, the test paths selection "rules" are modified and the method loops back to step 275.

Figure 9:
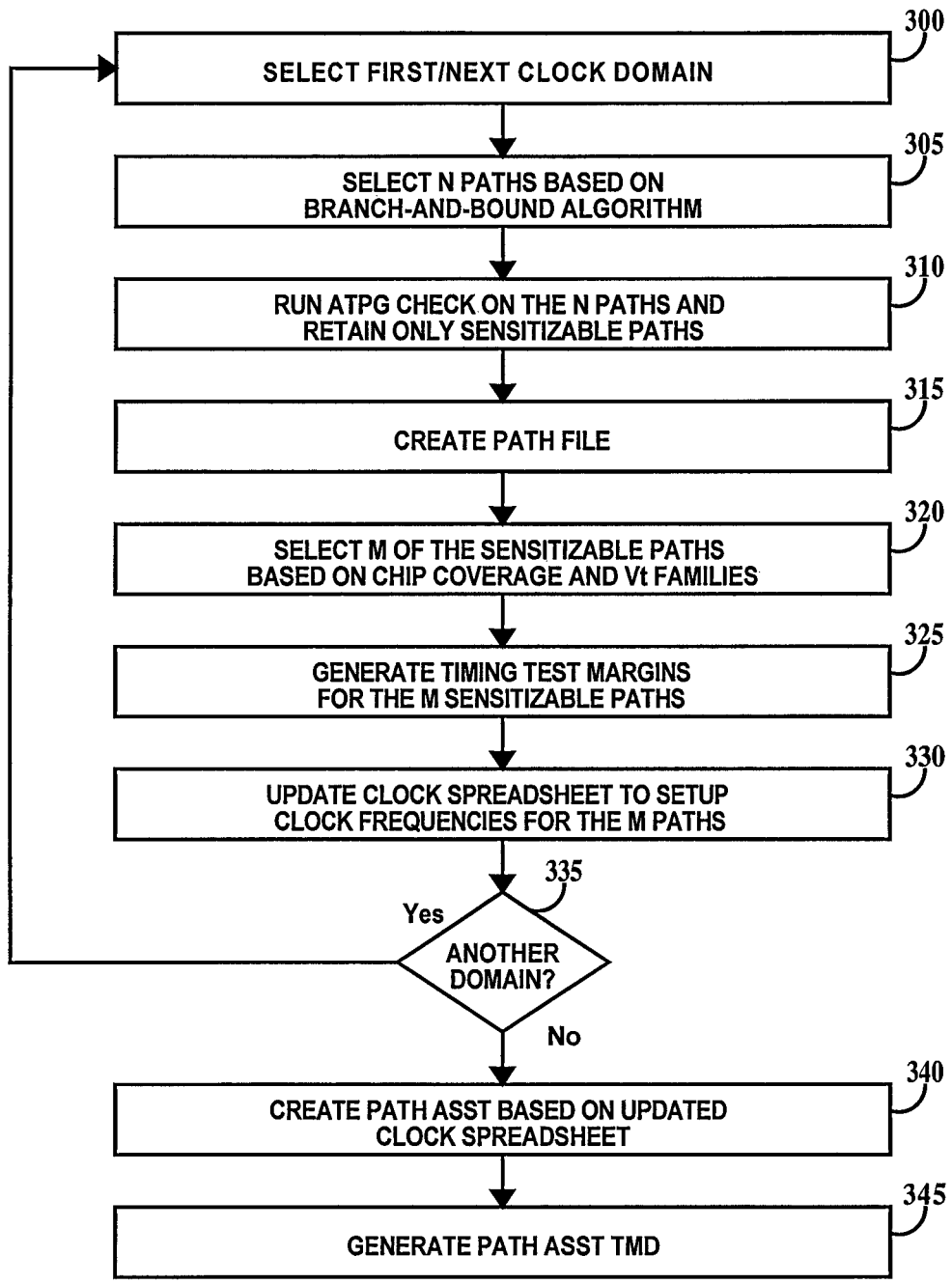
FIG. 9 is a flow diagram of a method of selecting test paths according to an embodiment of the present invention.

FIG. 9 is a flow diagram of a method of selecting test paths according to an embodiment of the present invention. In step 300, the first/next clock domain of the integrated circuit is selected. In step 305, N critical paths are selected based on a branch-and-bound algorithm. N is an integer greater than 1. In one example, N is at least about 1000. In step 310, an ATPG check is run on the N paths and only the sensitizable (e.g., testable) paths are retained. In step 315, a path file is created. The path file includes such information as physical path location, designed path timing delay, designed slack (slack is the difference between required arrival time of data at a latch and the actual time the data arrives), and designed upper and lower timing bounds (e.g., WC and BC) for each path. In step 320, M of the sensitizable paths are selected to include paths from different regions of the chip and to include a variety of paths of different Vt (threshold voltage) families because the designed delay in a path is a function of the designed Vt of the transistors of the circuit path. M is an integer greater than 1. It should be understood that the term paths of different Vt does not mean that the path has transistors of different Vt, but rather, the transistors of one path have different Vts of another path, the transistors in any given path having the same Vt. In one example, step 320 is performed automatically. In one example, step 320 is performed manually. In one example, step 320 is performed automatically and then adjusted manually. In step 325, timing test margins (frequency and/or voltage) for the M sensitizable paths are generated based on the maximum frequency of the clock circuit (often a phase-lock-loop (PLL) circuit) generating the clock signal of the current clock domain. In step 330, the clock spreadsheet generated during design of the integrated circuit is updated to reflect the test clock frequency to be used for each of the M paths based on the test margins of step 330. In one example, step 330 is performed automatically. In one example, step 330 is performed manually. In one example, step 330 is performed automatically and then adjusted manually. In step 335, it is determined if there is another clock domain to process. If so, the method loops back to step 300, otherwise the method proceeds to step 340. In step 340, a path ASST is generated based on the updated clock spreadsheet. In step 345, a path ASST TMD is generated using, for example, an ATPG tool. Note M and N may vary from clock domain to clock domain.

Figure 10:
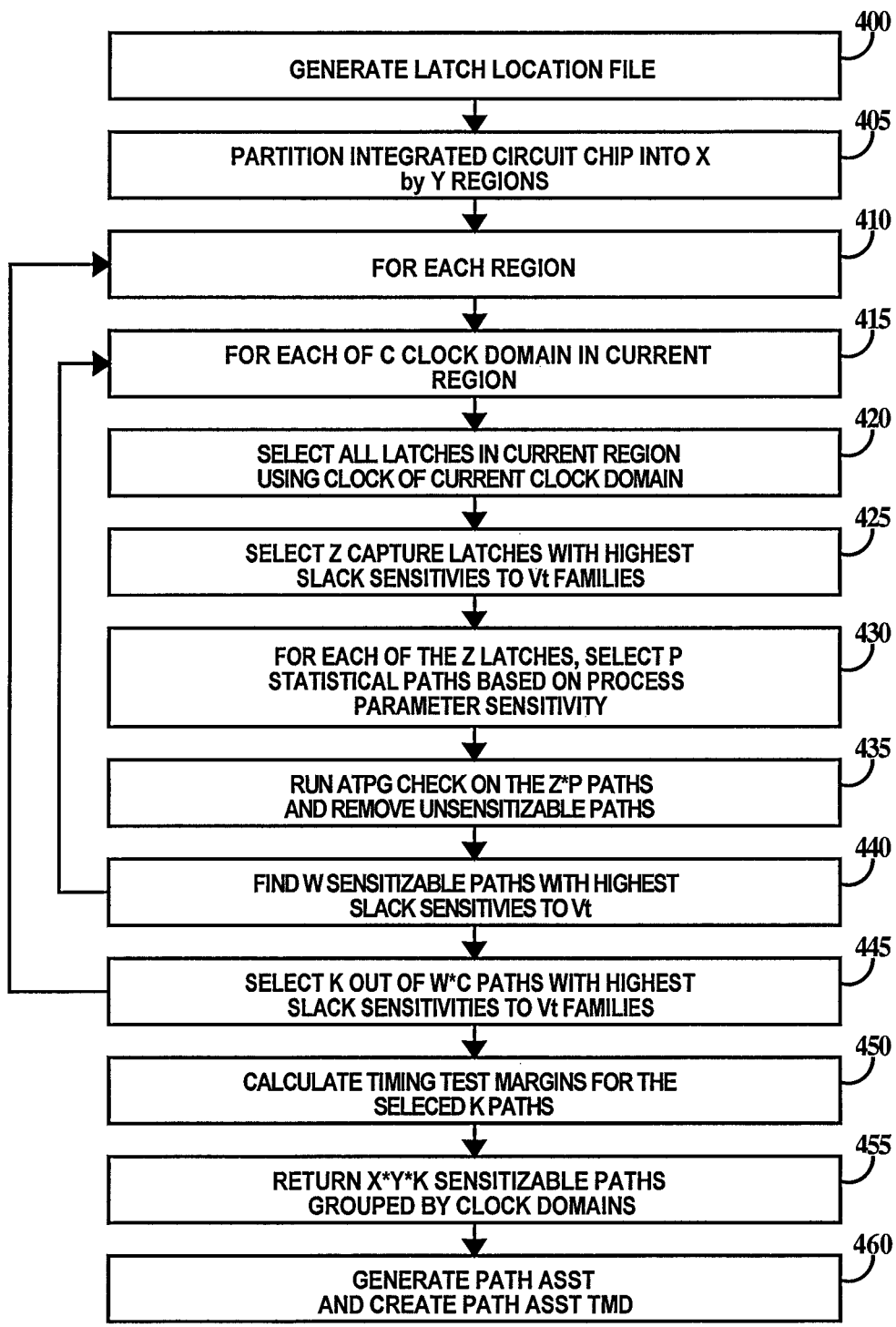
FIG. 10 is a flow diagram of a method of selecting test paths according to another embodiment of the present invention.

FIG. 10 is a flow diagram of a method of selecting test paths according to another embodiment of the present invention. In step 400, a latch location file is generated. The latch location file includes the location on the integrated circuit of all scan latches (e.g., LSSD latches) in the integrated circuit design. In step 405, the integrated circuit design is partitioned into X by Y (=R) regions. See for example, FIG. 2 where X=Y=4 and integrated circuit 100 has been partitioned into 16 regions. In step 410, a loop of steps by region is started. In step 415, a sub-loop of steps by clock domain is started which is performed for all clock domains in the current region. There are C clock domains in each region, but C may vary from region to region. X is an integer greater than 1. Y is an integer greater than 1. C is an integer greater than 1.

Starting the clock domain sub-loop, in step 420, all latches in the Current region and using the clock of the current clock domain are selected. In step 425, Z latches having the highest slack sensitivities to Vt families are selected. In order to break "ties" slack sensitivities to wiring parameters (e.g., length of wires by wiring level), test margins (e.g., voltage, frequency), may be used. Z is an integer greater than 1. In one example, Z=200. In step 430, for each of the Z latches, P statistical [define statistical] paths are selected based on process parameter sensitivities (e.g., across chip variations (e.g., high and low density of polysilicon lines, high and low density of substrate isolation, density of wiring, etc.) and wiring levels (e.g., which wiring levels are used and the length of wire on each level). P is an integer greater than 1. In one example, P=5. In step 435, an ATPG check is run on the Z*P (in the examples, 200*5=1000). It is preferred that the values of Z and P should be chosen to present about a thousand paths with P about two orders of magnitude greater than Z. In step 435, an ATPG check is run on the Z*P paths to remove unsensitizable paths. In step 440, W sensitizable paths having the highest slack sensitivities to Vt families are selected. In order to break "ties" slack sensitivities to wiring parameters (e.g., length of wires by wiring level), test margins (e.g., voltage, frequency), may be used. In one example, W=2. Steps 420 through 440 are repeated for each clock domain in the current region.

Continuing the region loop, in step 445, K of the W*C sensitizable paths having the highest slack sensitivities to Vt families are selected. In order to break "ties" slack sensitivities to wiring parameters (e.g., length of wires by wiring level), test margins (e.g., voltage, frequency), may be used. In one example, K=2. In step 450, the test timing margins (voltage, frequency) are calculated for the K paths. Steps 410, 445 and 450 are repeated for each region.

In step 455, there will be X*Y*K sensitizable paths grouped by clock domains. In the example of X=4, Y=4 and K=2 there will be 32 paths. In step 460, a path ASST is generated for PPT testing the X*Y*K sensitizable paths. Also a path ASST TMD is generated using, for example, an ATPG tool. Note M and N may vary from clock domain to clock domain.

Generally, the method described herein with respect to methods for selecting critical paths for performance testing integrated circuit chips is practiced with a general-purpose computer and the methods described supra in the flow diagrams of FIGS. 6, 7, 8, 9 and 10 may be coded as a set of instructions on removable or hard media for use by the general-purpose computer.

Figure 11:
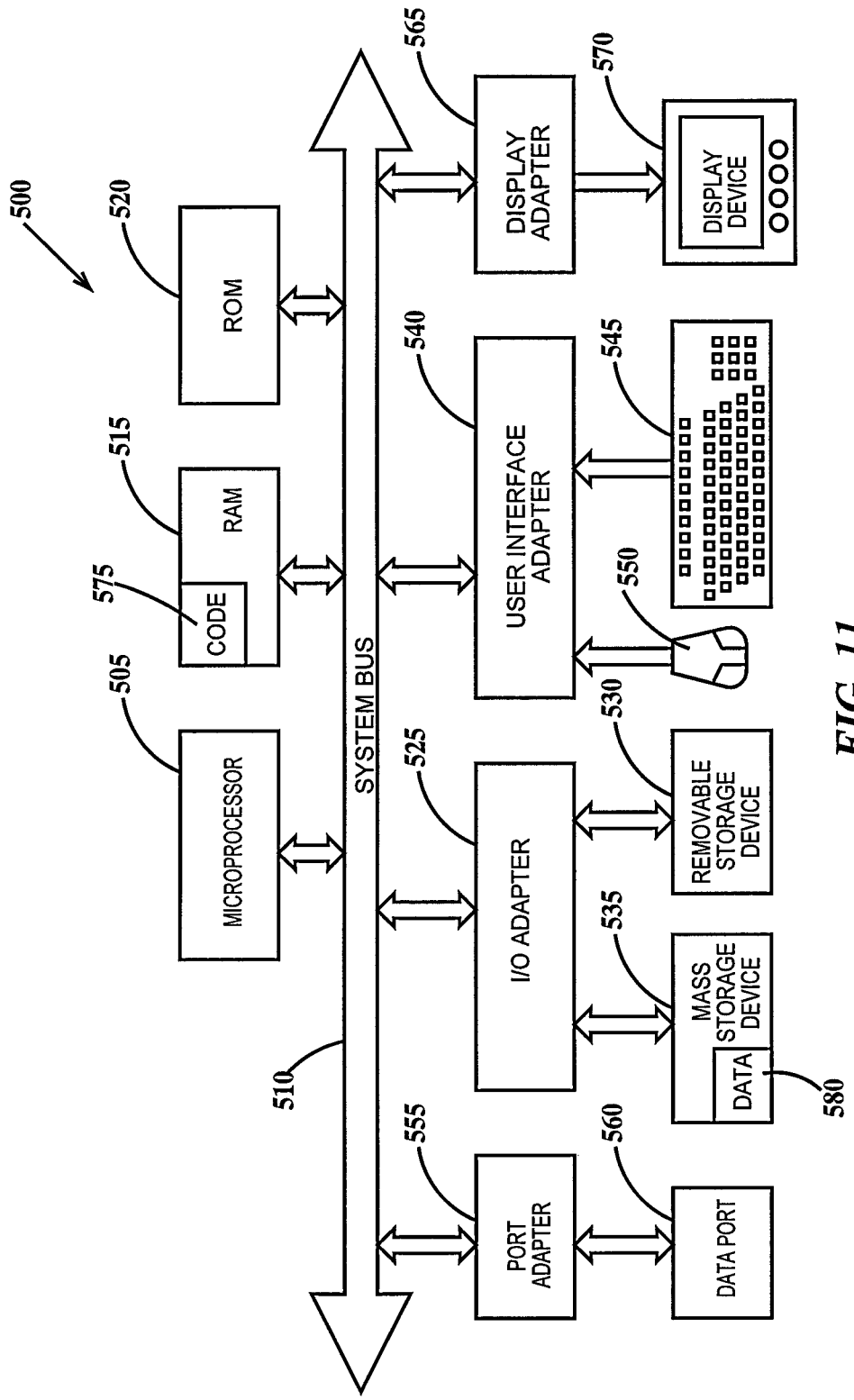
FIG. 11 is a schematic block diagram of a general-purpose computer that may be used in practicing embodiments of the present invention.

FIG. 11 is a schematic block diagram of a general-purpose computer that may be used in practicing embodiments of the present invention. In FIG. 11, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 530, fed through data port 560 or typed in using keyboard 545.

Certain portions of embodiments of the present invention are practiced with a computer (e.g., computer 500 of FIG. 11) linked to or included in a test system.

Thus the embodiments of the present invention provide methods of selecting critical delay paths of integrated circuits for performance testing integrated circuit chips; the methods allow performance testing of integrated circuit chips that require less time and resource than conventional performance testing methods and at the same time reduce, if not eliminate, false accepts and false rejects.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   identifying clock domains having multiple data paths of an integrated circuit design having multiple clock domains performing a beginning of life timing simulation for all data paths;
   selecting, from said data paths, critical paths for each clock domain of the multiple clock domains, said critical paths being data paths between an input point and an output point wherein a time delay of a data signal presented at said input point and received at said output point must be between an upper performance specification and a lower performance specification;
   using a computer, for each clock domain of said multiple clock domains, selecting the sensitizable paths of said critical paths;
   for each clock domain of said multiple clock domain, selecting test paths from the sensitizable critical paths generating process parameter values for each critical path, said selecting said test paths from said sensitizable critical paths based in part on said process parameter values; and
   using a computer, creating a test program to performance test said test paths.

2. The method of claim 1, further including:
   performing an AC noise simulation of said integrated circuit design and selecting a power level range having minimal signal-to-power noise coupling; and
   performing said beginning of life timing simulation using said power level range.

3. The method of claim 1, further including:
   defining process parameters;
   performing a beginning of life timing simulation for all data paths; and
   generating process parameter values for each of said critical paths; and
   selecting said test paths from said sensitizable critical paths such that sensitivity to said process parameters varies between said test paths.

4. The method of claim 1, further including:
   performing an AC noise simulation of said integrated circuit design; and
   selecting said critical paths from low power supply voltage variation regions of said integrated circuit design.

5. The method of claim 1, further including:
   setting test program path delay limits for said test paths based on (i) a worst case of late data arrival and an early clock at an input point of a sensitizable path of said subsets of sensitizable paths and (ii) a best case of early data arrival and a late clock at an input point of said test paths.

6. The method of claim 1, further including:
   selecting said sensitizable paths of critical paths using an automatic test pattern generator check program.

7. The method of claim 1, wherein all clocked elements of said critical paths are clocked with a same clock signal.

8. The method of claim 1, further comprising:
for each clock domain:
selecting said sensitizable critical paths to include paths from different regions of said integrated circuit design and to include sensitizable paths of different Vt families;
generating timing test margins for each path of said sensitizable critical paths; and
setting up test clock frequencies for each path of said sensitizable critical paths.

9. The method of claim 1, wherein said selecting said critical paths is performed using a branch-and-bound algorithm.

10. The method of claim 1, further including:
performing an automatic test pattern generator check on said critical paths and retaining only critical paths that are sensitizable.

11. The method of claim 8, wherein said test margins are based on the maximum frequency of the clock signal of said selected clock domain.

12. The method of claim 8, further including:
creating a path file having an entry for each sensitizable critical path, each entry including physical path locations, designed path timing delay, designed slack and designed upper and lower timing bounds.

13. A computer program product, comprising:
a computer usable storage device having a computer readable program code embodied therein, said computer readable program code comprising an algorithm adapted to implement a method for test path selection and test program generation for performance testing integrated circuit chips, said method comprising the steps of:
identifying clock domains having multiple data paths of an integrated circuit design having multiple clock domains performing a beginning of life timing simulation for all data paths;
selecting, from said data paths, critical paths for each clock domain of the multiple clock domains, said critical paths being data paths between an input point and an output point wherein a time delay of a data signal presented at said input point and received at said output point must be between an upper performance specification and a lower performance specification;
for each clock domain of said multiple clock domain, selecting the sensitizable paths of said critical paths;
for each clock domain of said multiple clock domain, selecting test paths from the sensitizable critical paths generating process parameter values for each critical path, said selecting said test paths from said sensitizable critical paths based in part on said process parameter values; and
creating a test program to performance test said test paths.

14. The computer program product of claim 13, the method further including:
performing an AC noise simulation of said integrated circuit design and selecting a power level range having minimal signal-to-power noise coupling; and
performing said beginning of life timing simulation using said power level range.

15. The computer program product of claim 13, the method further including:
defining process parameters;
performing a beginning of life timing simulation for all data paths; and
generating process parameter values for each of said critical paths; and
selecting said test paths from said sensitizable critical paths such that sensitivity to said process parameters varies between said test paths.

16. The computer program product of claim 13, the method further including:
performing an AC noise simulation of said integrated circuit design; and
selecting said critical paths from low power supply voltage variation regions of said integrated circuit design.

17. The computer program product of claim 13, the method further including:
setting test program path delay limits for said test paths based on (i) a worst case of late data arrival and an early clock at an input point of a sensitizable path of said subsets of sensitizable paths and (ii) a best case of early data arrival and a late clock at an input point of said test paths.

18. The computer program product of claim 13, the method further including:
selecting said sensitizable paths of critical paths using an automatic test pattern generator check program.

19. The computer program product of claim 13, wherein all clocked elements of said critical paths are clocked with a same clock signal.

20. The computer program product of claim 13, the method further comprising:
for each clock domain:
selecting said sensitizable critical paths to include paths from different regions of said integrated circuit design and to include sensitizable paths of different Vt families;
generating timing test margins for each path of said sensitizable critical paths; and
setting up test clock frequencies for each path of said sensitizable critical paths.

21. The computer program product of claim 13, wherein said selecting said critical paths is performed using a branch-and-bound algorithm.

22. The computer program product of claim 13, the method further including:
performing an automatic test pattern generator check on said critical paths and retaining only critical paths that are sensitizable.

23. The computer program product of claim 20, wherein said test margins are based on the maximum frequency of the clock signal of said selected clock domain.

24. The computer program product of claim 20, the method further including:
creating a path file having an entry for each sensitizable critical path, each entry including physical path locations, designed path timing delay, designed slack and designed upper and lower timing bounds.

* * * * *